(12) United States Patent
Moler et al.

(10) Patent No.: US 10,276,776 B2
(45) Date of Patent: Apr. 30, 2019

(54) MECHANICALLY AMPLIFIED SMART MATERIAL ACTUATOR UTILIZING LAYERED WEB ASSEMBLY

(71) Applicant: Viking AT, LLC, Sarasota, FL (US)

(72) Inventors: Jeffery B. Moler, Sarasota, FL (US); Ben Boor, Sarasota, FL (US)

(73) Assignee: Viking AT, LLC, Sarasota, FL (US)

( * ) Notice: Subject to any disclaimer, the term of this patent is extended or adjusted under 35 U.S.C. 154(b) by 240 days.

(21) Appl. No.: 15/107,601

(22) PCT Filed: Dec. 23, 2014

(86) PCT No.: PCT/US2014/072026
§ 371 (c)(1),
(2) Date: Jun. 23, 2016

(87) PCT Pub. No.: WO2015/100280
PCT Pub. Date: Jul. 2, 2015

(65) Prior Publication Data
US 2016/0322558 A1    Nov. 3, 2016

Related U.S. Application Data

(60) Provisional application No. 61/920,548, filed on Dec. 24, 2013.

(51) Int. Cl.
*H02N 2/04* (2006.01)
*H01L 41/09* (2006.01)
*H01L 41/083* (2006.01)

(52) U.S. Cl.
CPC ............ *H01L 41/09* (2013.01); *H01L 41/083* (2013.01); *H02N 2/043* (2013.01); *H02N 2/046* (2013.01)

(58) Field of Classification Search
CPC ........ H02N 2/046; H02N 2/043; H01L 41/09; H01L 41/083; H01L 41/0953
See application file for complete search history.

(56) References Cited

U.S. PATENT DOCUMENTS

| | | | |
|---|---|---|---|
| 1,922,196 | A | 8/1933 | Butler |
| 4,435,666 | A | 3/1984 | Fukui et al. |
| 4,442,372 | A | 4/1984 | Roberts |
| 4,518,887 | A | 5/1985 | Yano et al. |
| 4,547,086 | A | 10/1985 | Matsumoto et al. |
| 4,570,095 | A | 2/1986 | Uchikawa |
| 4,633,120 | A | 12/1986 | Sato et al. |

(Continued)

FOREIGN PATENT DOCUMENTS

| | | |
|---|---|---|
| JP | 2228275 | 9/1990 |
| JP | 2003251261 | 11/1991 |
| JP | 2004130681 | 5/1992 |
| JP | 04164581 | 6/1992 |
| JP | 05189046 | 7/1993 |

(Continued)

*Primary Examiner* — J. San Martin
(74) *Attorney, Agent, or Firm* — William G. Giltinan; Carlton Fields, PA

(57) ABSTRACT

A smart material actuator comprising a layered web assembly, compensator, smart material device and at least one actuating arm. The web assembly comprises a first surface in operable contact with the smart material device and having at least one resilient member in operable connection with the compensator and the actuating arm. Upon activation of the smart material device, the resilient member flexes and the actuating arm moves. The web assembly is formed of joined layers of inner and outer plates.

19 Claims, 7 Drawing Sheets

(56) References Cited

U.S. PATENT DOCUMENTS

| | | | |
|---|---|---|---|
| 4,783,610 | A | 11/1988 | Asano |
| 4,870,827 | A | 10/1989 | McFarlin et al. |
| 4,874,980 | A * | 10/1989 | Mine ............... H02N 2/043 310/328 |
| 4,977,916 | A | 12/1990 | Ohmi et al. |
| 5,096,388 | A | 3/1992 | Weinberg |
| 5,410,207 | A * | 4/1995 | Miura ............... H01L 41/0953 310/328 |
| 5,751,091 | A | 5/1998 | Takahashi |
| 5,793,571 | A | 8/1998 | Jurgenson et al. |
| 5,798,600 | A | 8/1998 | Sager et al. |
| 5,828,157 | A | 10/1998 | Miki |
| 5,946,969 | A | 9/1999 | Munekata |
| 6,213,739 | B1 | 4/2001 | Phallen |
| 6,288,985 | B1 | 9/2001 | Jordache et al. |
| 6,359,370 | B1 | 3/2002 | Chang |
| 6,435,840 | B1 | 8/2002 | Sharma |
| 20,030,066 | | 1/2003 | Smith et al. |
| 6,513,213 | B1 | 2/2003 | Muramatsu et al. |
| 6,520,479 | B1 | 2/2003 | Sato |
| 6,548,938 | B2 | 4/2003 | Moler |
| 6,717,332 | B2 | 4/2004 | Moler |
| 6,737,788 | B2 | 5/2004 | Moler |
| 6,759,790 | B1 | 7/2004 | Bugel |
| 6,784,599 | B1 | 8/2004 | Stoecklein |
| 6,789,087 | B1 | 9/2004 | Sako |
| 6,834,419 | B2 | 12/2004 | Lopatin et al. |
| 6,834,491 | B2 | 12/2004 | Coppola |
| 6,836,056 | B2 | 12/2004 | Oudshoorn |
| 6,870,305 | B2 | 3/2005 | Moler |
| 6,924,586 | B2 | 8/2005 | Moler |
| 6,975,061 | B2 | 12/2005 | Moler |
| 6,979,933 | B2 | 12/2005 | Oudshoom |
| 7,036,769 | B2 | 5/2006 | Wood |
| 7,040,349 | B2 * | 5/2006 | Moler ............... F16K 27/003 137/884 |
| 7,064,472 | B2 | 6/2006 | Pelrine |
| 7,090,457 | B2 | 8/2006 | Martin |
| 7,104,768 | B2 | 9/2006 | Richter |
| 7,126,259 | B2 | 10/2006 | Moler |
| 7,132,781 | B2 | 11/2006 | Moler |
| 7,163,385 | B2 | 1/2007 | Gharib |
| 7,190,102 | B2 | 3/2007 | VanderSluis |
| 7,217,108 | B2 | 5/2007 | Herwig |
| 7,258,533 | B2 | 8/2007 | Tanner |
| 7,261,352 | B2 | 8/2007 | Maslov et al. |
| 7,368,856 | B2 | 5/2008 | Moler |
| 7,405,509 | B2 * | 7/2008 | Ohashi ............... H02N 2/043 310/328 |
| 7,429,815 | B2 | 9/2008 | Gibson et al. |
| 7,453,187 | B2 | 11/2008 | Richards |
| 7,462,976 | B2 | 12/2008 | Semmere, Jr. |
| 7,524,298 | B2 | 4/2009 | Gharib |
| 7,560,856 | B2 | 7/2009 | Chen |
| 7,564,171 | B2 | 7/2009 | Moler |
| 7,667,375 | B2 | 2/2010 | Berkcan |
| 7,687,977 | B2 | 3/2010 | Xu |
| 7,732,994 | B2 | 6/2010 | Clingman et al. |
| 7,839,055 | B2 | 11/2010 | Bagamitsu |
| 7,915,790 | B2 | 3/2011 | Heim et al. |
| 7,939,992 | B2 | 5/2011 | Ehrlich |
| 8,162,286 | B2 | 4/2012 | Sawada |
| 8,669,689 | B2 * | 3/2014 | Moler ............... H02N 2/043 310/328 |
| 8,879,775 | B2 | 11/2014 | Moler et al. |
| 9,011,118 | B2 | 4/2015 | Chou |
| 2002/0109436 | A1 | 8/2002 | Peng et al. |
| 2003/0006676 | A1 | 1/2003 | Smith et al. |
| 2003/0127948 | A1 | 7/2003 | Moler |
| 2004/0035106 | A1 * | 2/2004 | Moler ............... F16K 27/003 60/527 |
| 2004/0263025 | A1 | 12/2004 | Moler |
| 2005/0116583 | A1 | 6/2005 | Nishio |
| 2005/0146248 | A1 * | 7/2005 | Moler ............... H02N 2/043 310/346 |
| 2005/0146698 | A1 | 7/2005 | Hols et al. |
| 2005/0231077 | A1 | 10/2005 | Moler |
| 2006/0017349 | A1 | 1/2006 | Moler |
| 2006/0110274 | A1 | 5/2006 | Gottschalk |
| 2006/0159568 | A1 | 7/2006 | Lutz |
| 2007/0025868 | A1 | 2/2007 | Swayze |
| 2007/0064068 | A1 | 3/2007 | Piatt et al. |
| 2007/0247024 | A1 | 10/2007 | Semmere, Jr. |
| 2007/0273248 | A1 | 11/2007 | Wright |
| 2008/0038128 | A1 | 2/2008 | Haar |
| 2008/0061031 | A1 | 3/2008 | Hashiguchi et al. |
| 2008/0170953 | A1 | 7/2008 | Lund |
| 2008/0193307 | A1 | 8/2008 | Elata |
| 2008/0265712 | A1 | 10/2008 | Ulm |
| 2008/0315719 | A1 | 12/2008 | Gibson |
| 2009/0152990 | A1 | 6/2009 | Brown |
| 2009/0199633 | A1 | 6/2009 | Sugimoto |
| 2009/0047144 | A1 | 9/2009 | Leece et al. |
| 2010/0111733 | A1 | 5/2010 | Ramunas |
| 2010/0207411 | A1 | 9/2010 | Sun et al. |
| 2011/0046748 | A1 | 2/2011 | Martin |
| 2011/0309721 | A1 | 12/2011 | Moler |
| 2012/0001518 | A1 | 1/2012 | Moler |
| 2012/0038245 | A1 | 2/2012 | Moler |
| 2012/0230848 | A1 | 9/2012 | McQuary et al. |
| 2013/0108475 | A1 | 5/2013 | Moler |
| 2013/0234561 | A1 | 9/2013 | Moler |
| 2015/0337823 | A1 | 11/2015 | Moler |

FOREIGN PATENT DOCUMENTS

| | | |
|---|---|---|
| JP | 07129244 | 5/1995 |
| JP | 07301354 | 11/1995 |
| JP | 07337044 | 12/1995 |
| JP | 09018064 | 1/1997 |
| JP | 09100930 | 4/1997 |
| JP | 2009183241 | 7/1997 |
| JP | 11146663 | 5/1999 |
| JP | 2000322129 | 11/2000 |
| JP | 2002058260 | 2/2002 |
| JP | 2002118303 | 4/2002 |
| JP | 2002263979 | 9/2002 |
| JP | 2003199366 | 7/2003 |
| JP | 2003244973 | 8/2003 |
| JP | 2004048955 | 2/2004 |
| JP | 2004197754 | 7/2004 |
| JP | 2005149679 | 6/2005 |
| JP | 2005522163 | 7/2005 |
| JP | 2005302711 | 10/2005 |
| JP | 2006507784 | 3/2006 |
| JP | 2006138913 | 6/2006 |
| JP | 2007006616 | 1/2007 |
| JP | 2007512713 | 5/2007 |
| JP | 2008029111 | 2/2008 |
| JP | 2008099399 | 4/2008 |
| JP | 2009038901 | 2/2009 |
| JP | 2009048506 | 3/2009 |
| WO | 2003083957 | 10/2003 |
| WO | 2004006349 | 1/2004 |
| WO | 2005053045 | 6/2005 |
| WO | 2005086337 | 9/2005 |
| WO | 2009056828 | 5/2009 |
| WO | 2009093907 | 7/2009 |
| WO | 2009152409 | 12/2009 |
| WO | 2011006028 | 1/2011 |
| WO | 2011006164 | 1/2011 |
| WO | 2011023375 | 3/2011 |
| WO | 2011029081 | 3/2011 |
| WO | 2011103324 | 8/2011 |
| WO | 2011103328 | 8/2011 |
| WO | 2012079012 | 9/2012 |
| WO | 2012118548 | 9/2012 |
| WO | 2003067674 | 8/2013 |

* cited by examiner

MECHANICALLY AMPLIFIED SMART MATERIAL ACTUATOR UTILIZING LAYERED WEB ASSEMBLY

This application claims priority to provisional application No. 61/920,548, filed Dec. 24, 2013, which is incorporated by reference herein in its entirety.

BACKGROUND

The present invention relates to a mechanically amplified, smart material actuator apparatus formed by assembling a smart material device, compensator, at least one actuating arm, and a web assembly comprising a plurality of plates. Mechanically amplified smart material actuators utilizing web assemblies are known in the art. Such actuators, however, typically utilize web assemblies that are formed from a unitary piece of a material such as stainless steel. Such actuators can have high manufacturing costs, however, in part due to the expense of manufacturing a web assembly single piece.

The present invention provides a smart material actuator in which the web assembly is formed from a plurality of plates that are joined together. Forming a web assembly from layered plates can be less expensive as plates can be manufactured with less expensive processes such as stamping a plate from a metal sheet.

This application hereby incorporates by reference, in their entirety, U.S. published applications 2011/0309721, 2012/0038245, 2012/0001518, 2012/0297880, 2012/0308055, 2013/0108475, 2013/0234561, 2013/0234562; and U.S. Pat. Nos.:

6,717,332;
6,548,938;
6,737,788;
6,836,056;
6;759,790;
7,132,781;
7,126,259;
6,870,305;
6,975,061;
7,564,171
7,168,856; and
6,924,586.

BRIEF DESCRIPTION OF THE DRAWINGS

Other features in the invention will become apparent from the attached drawings, which illustrate certain preferred embodiments of the apparatus of this invention, wherein.

DETAILED DESCRIPTION

Figure 1:
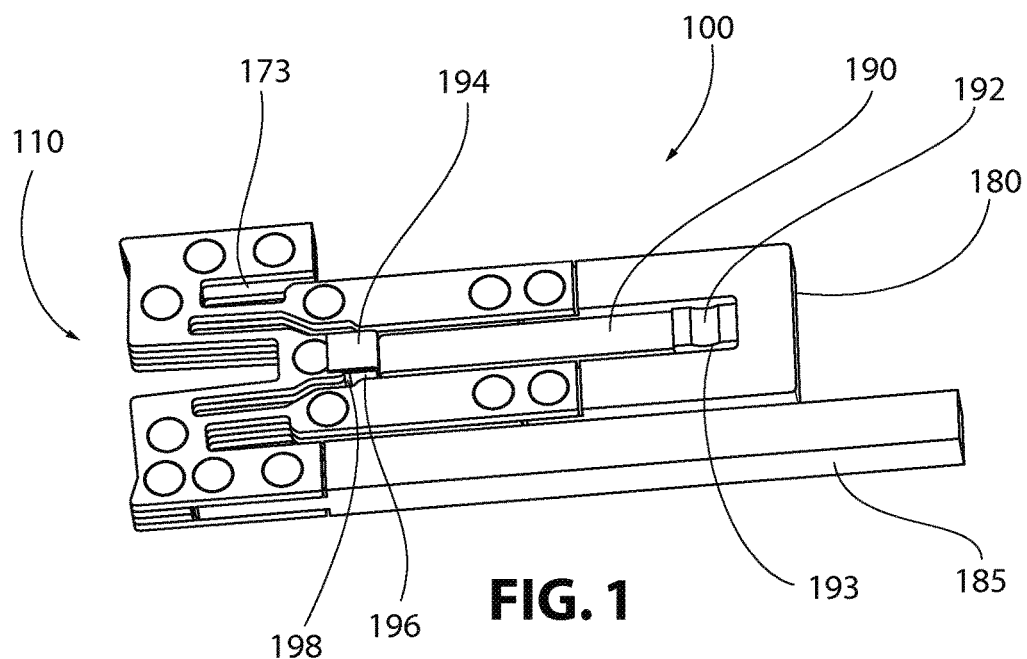
FIG. 1 is a perspective view of a preferred embodiment of a smart material actuator according to the present invention having one actuating arm and a web assembly comprising four plates.

While the following describes preferred embodiments of this invention, it is understood that this description is to be considered only as illustrative of the principles of the invention and is not to be limitative thereof, as numerous other variations, all within the scope of the invention, will readily occur to those of ordinary skill in the art.

It will be noted that in the illustrated embodiments, different embodiments comprise the same or similar components, Where components in different embodiments have a similar structure, but are not necessarily common parts, the components have element numbers with different first digits, but common second and third digits. For example, and without limitation, web assemblies 110, 210, 310, 410, 510, and 610 share attributes of a common structure, but are not identical parts. Where the same element numbers are used, the drawing illustrates uses of multiple copies of essentially the same component or feature. For example, and without limitation, actuating arms 685 are two substantially identical components used at different locations on smart material actuator 600.

Finally, it will be noted that dimension lines with letters are used herein to illustrate distances, in order to facilitate discussion of relative dimensions in certain embodiments.

Herein, the following terms shall have the following meanings:

The term "adapted" means sized, shaped, configured, dimensioned, oriented and arranged as appropriate.

The term "smart material device" means a device comprising a material that expands when an electric potential is applied or generates an electric charge when. mechanical force is applied. Smart material devices include, without limitation, devices formed of alternating layers of ceramic piezoelectric material fired together (a so-called co-fired multilayer ceramic piezoelectric stack such as those available from suppliers including NEC) or a device formed of one or more layers of material out from single crystal piezoelectric material. In the foregoing, the term "piezoelectric material" also includes so-called "smart materials,"

sometimes created by doping known piezoelectric materials to change their electrical or mechanical properties.

The term "web assembly" means a structure comprising at least one resilient member and being adapted to translate motion to at least one actuating arm. Motion is translated by applying a force that causes the resilient member to flex. The resilient nature of the resilient member, however, is such that it will return to substantially their original configuration upon removal of that force under normal operating conditions. There are a wide variety of materials that may be used to form a resilient members, including, limitation, steel, stainless steel, aluminum, carbon fiber, plastic and fiberglass. Embodiments of the actuator assembly of the present invention utilize inner plates sandwiched between outer plates to create a web assembly. Web assemblies according to the present invention can thus be more cost effective to produce, and can also be formed of standard-sized plates so that thicknesses of web assemblies can be varied by adding, removing or replacing inner plates, or using plates of different materials.

The term "activation" when used in conjunction with "actuator" or "smart material device" means application of an electrical potential and current suitable to cause the smart material device to expand in an amount sufficient to flex the resilient member of at least one web assembly.

The definitions and meanings of other terms herein shall be apparent from the following description, the figures, and the context which the terms are used.

Referring now to FIG. 1, a preferred embodiment of a smart material actuator 100 is illustrated. Smart material actuator 100 comprises web assembly 110, compensator 180, actuating arm 185, and smart material device 190. In the illustrated embodiment, smart material device 190 is compressed between compensator 180 and web assembly 110 utilizing swage block 192, terminal 194, insulating spacer 196 and end spacer 198.

Figure 2:
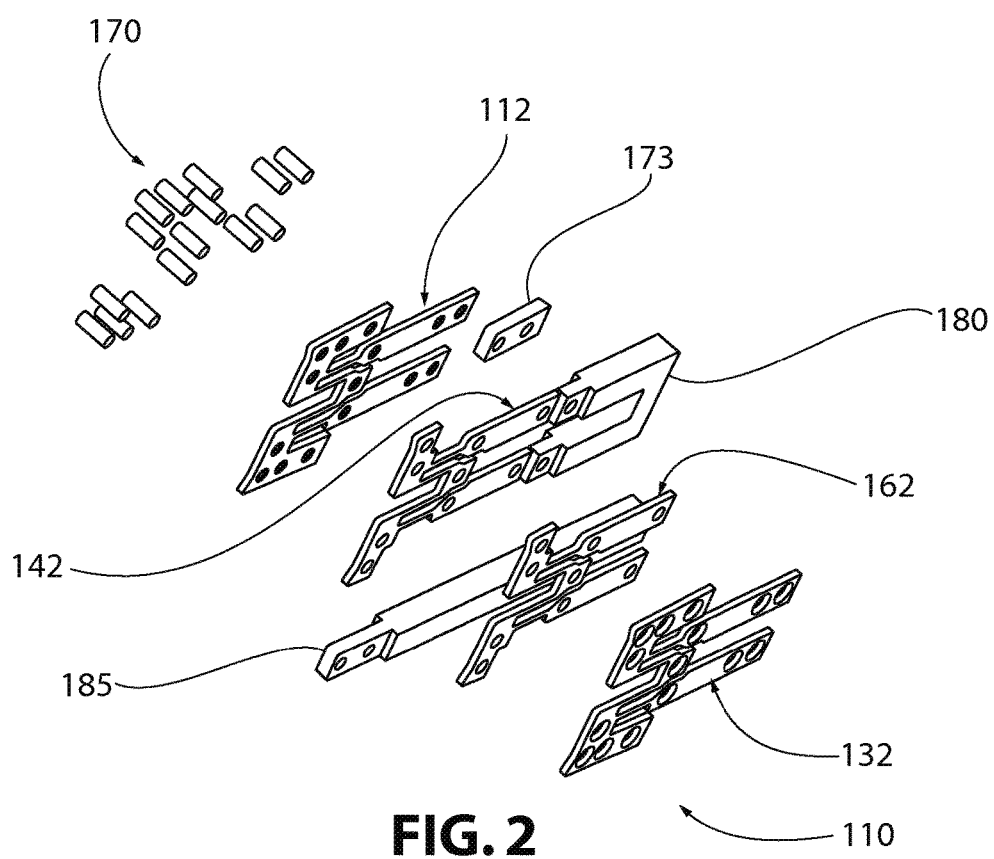
FIG. 2 is an exploded, perspective view of the web assembly, compensator, connectors, actuating arm and arm spacer of the embodiment illustrated in FIG. 1.

Referring to FIG. 2, web assembly 110 comprises a first outer plate 112, a second outer plate 132. Inner plate 142 and second inner plate 162 are interposed between first outer plate 112 and second outer plate 132. First outer plate 112 and second outer plate 132 are substantially identical in the embodiment illustrated. Similarly, inner plate 142 and second inner plate 162 are substantially identical in the illustrated embodiment. Connectors serve to secure inner plate 142 and second inner plate 162 between first outer plate 112 and second outer plate 132 to form web assembly 110. Connectors 170 also serve to secure actuating arm 185, compensator 180, and arm spacer 173 to web assembly 110. Connectors 170 may conveniently be rivets, bolts, screws, pressed-in pins, or other preferably mechanical fasteners known to those of skill in the art. Connectors 170 may be removable such as (without limitation) bolts that screw into web assembly 110 or that s into sleeves (not illustrated), or may be substantially non-removable such as rivets or press fit pins depending on the application.

Figure 3:
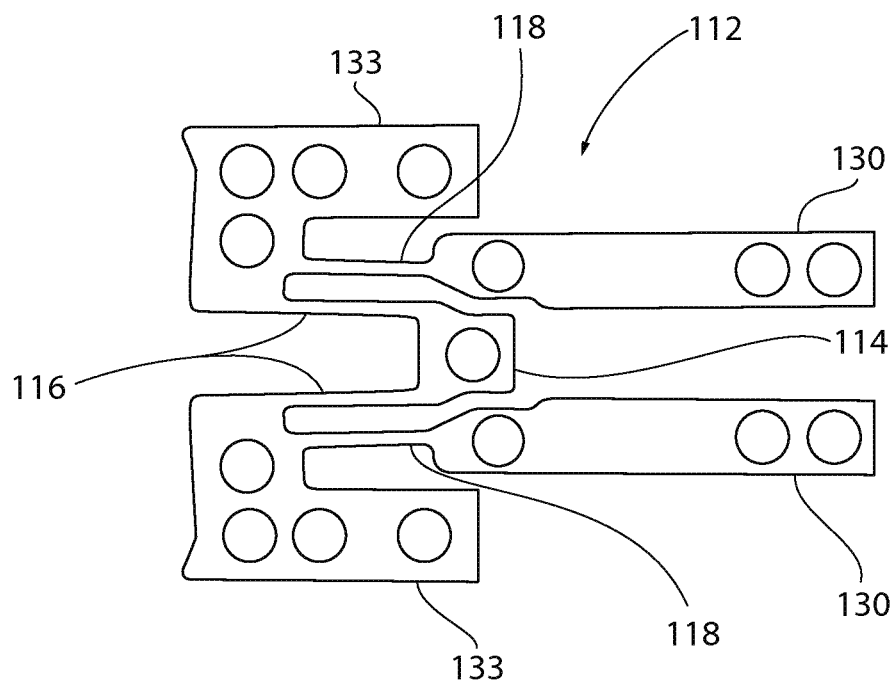
FIG. 3 is a side view of an outer plate suitable for use in the embodiment illustrated in FIG. 1.

Referring to FIG. 3, first outer plate 112 comprises an outer plate support surface 114 connected to two outer plate inner resilient members 116. Two outer plate outer resilient members 118 are operably connected to a compensator attachment portion 130 and an actuating arm attachment portion 133.

Figure 4:
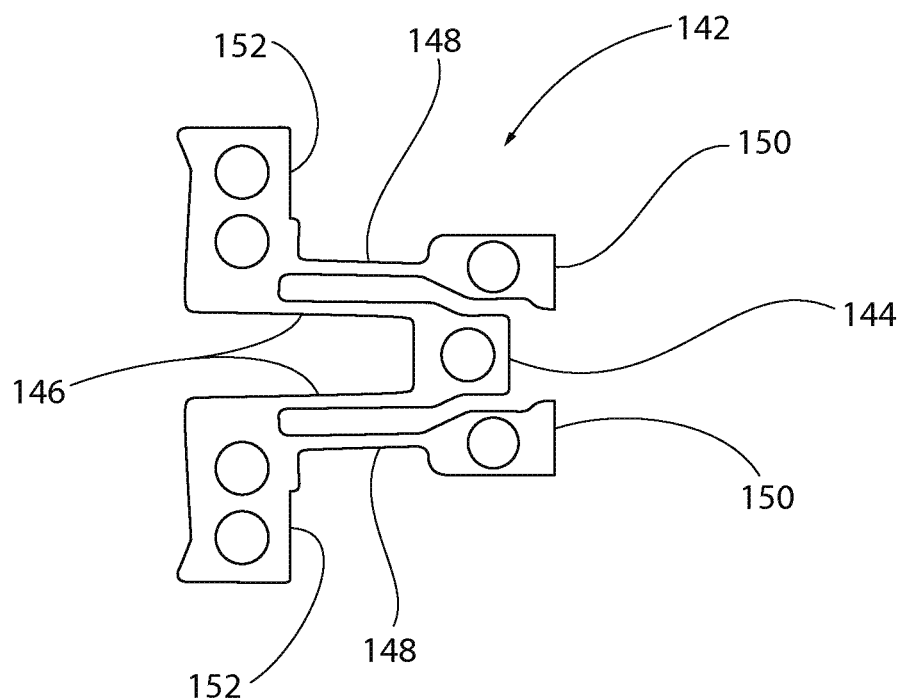
FIG. 4 is a side view of an inner plate suitable for use in the embodiment illustrated in FIG. 1.

Referring to FIG. 4, inner plate 142 comprises an inner plate support surface 144 connected to two inner plate inner resilient members 146, and two inner plate outer resilient members 148 connected to a compensator support portion 150, and an actuating arm support portion 152.

Referring to FIGS. 1, 2, 3 and 4, compensator 180 is adapted to attach to compensator attachment portions 130 of first outer plate 112 and corresponding compensator attachment portions (not numbered) of second outer plate 132. Compensator 180 is supported by compensator support portions 150 of inner plate 142 and corresponding compensator support portions (not numbered) of second inner plate 162.

Actuating arm 185 is adapted to attach to one of actuating arm attachment portions 133 of first outer plate 112, and one of corresponding actuating arm attachment portions (not numbered) of second outer plate 132. Actuating arm 185 is supported by one of actuating arm support portions 152 of inner plate 142 and one of corresponding compensator support portion (not numbered) of second inner plate 162.

In this way, when assembled, web assembly 110 forms a substantially solid assembly comprising layered web assembly 110, compensator, 180, and actuating arm 185. In embodiments in which one actuating arm 185 is needed, arm spacer 173 may be used to provide support, or an attachment structure (not illustrated) can be attached in the same location as arm spacer 173 to facilitate mounting smart material actuator 100 to a support structure (not illustrated). By making outer plates 112, 132 and inner plates 142, 162 as illustrated, one arm actuating structures and two arm actuating structures can be formed from the same sets of components by selecting either arm spacer 173 or a second actuating arm (not illustrated).

Figure 5:
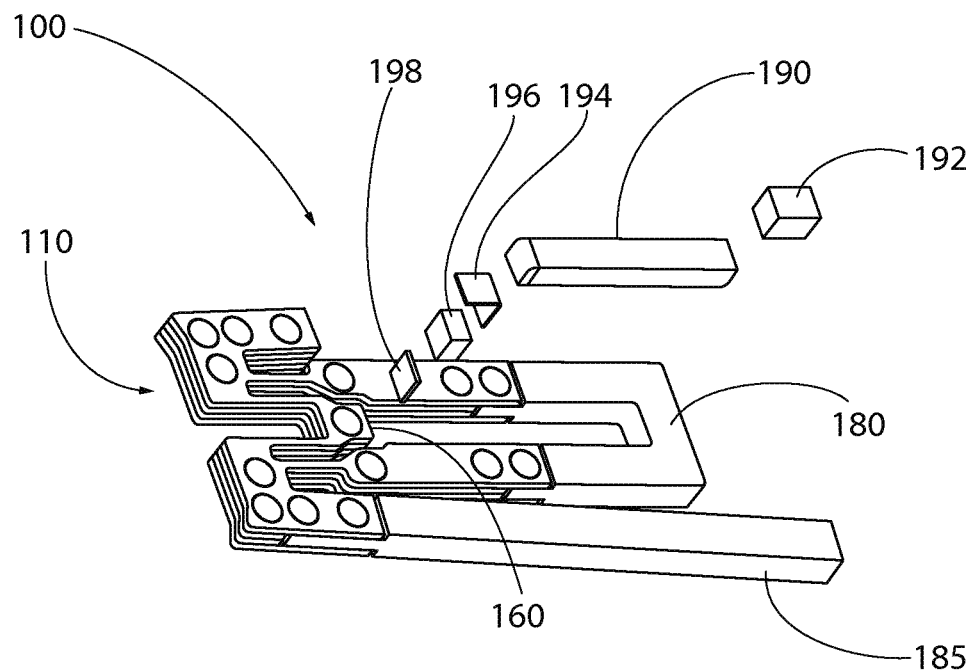
FIG. 5 is an exploded perspective view of e embodiment illustrated in FIG. 1 after assembly of the compensator, web assembly and actuating arm into an actuator frame, and prior to final assembly of the operable smart material actuator.
Figure 6:
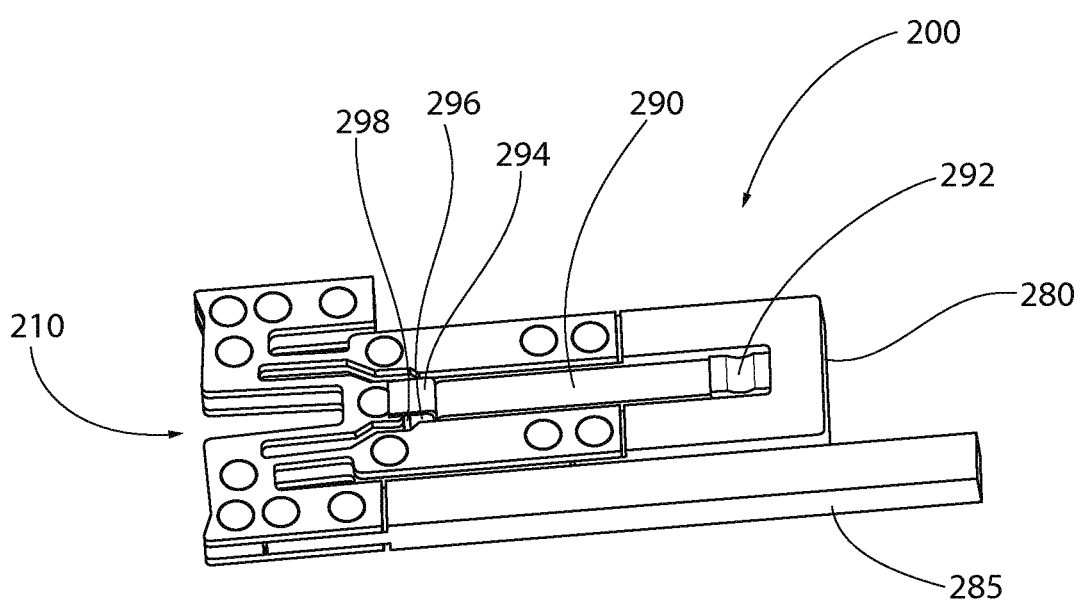
FIG. 6 is a perspective view of an alternate embodiment of the actuator assembly of the present invention having one inner plate.

Referring to FIG. 5, smart material device 190 can be inserted into the space formed between compensator 180 and first mounting surface 160. Referring to FIGS. 2, 3, and 4, it can be seen that first mounting surface 160 comprises outer plate support surface 114 and inner plate support surface 144, and corresponding support surfaces (not numbered) of second outer plate 132 and second inner plate 162.

In the illustrated embodiment, terminal 194, which may conveniently be a brass terminal, is electrically connected to smart material device 190, preferably connected to the positive line of a power source suitable to activate smart material device 190. The ground connection for smart material device 190 may be conveniently made through swage block 192 (which may suitably be an aluminum block) to compensator 180 and thereby the remainder of the body of smart material actuator 100. Insulating spacer 196 (which may conveniently be a ceramic insulator) is situated between terminal 194 and end spacer 198 in the embodiment shown. End spacer 198 may conveniently be a softer material such as aluminum such that, when compressed, end spacer 198 will conform to first mounting surface 160 which may not be perfectly flat due to manufacturing tolerances. One or both of stack insulating spacer 196 and second end spacer 198 may be adapted to electrically insulate terminal 194 from web assembly 110 either by use of an insulating material or inclusion of additional insulators (not illustrated) or insulating layers (not illustrated). While a variety of materials known to those of skill in the art can be used for insulating spacer 196, ceramic insulating materials such as are known to those of skill in the art are utilized in the embodiment shown.

It is understood that the positioning of swage block 192 adjacent to compensator 180 is a matter of choice and that the locations of swage block 192 and terminal 194 and spacers 196 and 198 may be rearranged without deviating from the present invention. By way of example, and without limitation, one suitable rearrangement would be to position swage block 192 substantially adjacent to first mounting surface 160 and to position terminal 194 and spacers 196 and 198 substantially adjacent to compensator 180. It will be further understood that where smart material device 190 has terminals on its sides instead of its ends, terminal 194 and spacers 196 and 198 may be eliminated. In such embodiments, however, use of a soft material end spacer can be advantageous in extending the life of smart material device 190 by helping ensure pressure is applied even cross the surface of its end.

Swage block 192 is preferably of aluminum, but may also be of other materials with the characteristic that when compressed, the length of swage block 192 will expand and remain expanded, thereby retaining smart material device within compensator 180 and applying a suitable preload on smart material device 190 as is discussed in the incorporated references and below. Applying a consistent and appropriate preload can improve the efficiency of the operation of smart material device 190 and extend its operational life. Use of swage block 192 helps achieve these benefits while simultaneously allowing for a simpler, more cost-effective assembly process by positioning smart material device 190, terminal 194 and spacers 196, 198 within the space formed by compensator 180, positioning swage block 192 at one end of smart material device 190, and compressing swage block 192 to provide the force necessary to elongate it so that it retains and applies preload to smart material device 190. Use of substantially non-compressible ceramics for insulating spacer 196 is convenient to limit the amount of increase in length required when swage block 192 is compressed. Use of comparatively softer materials such as aluminum for swage block 192 and brass, aluminum or copper for terminal 194 is also convenient as such materials can conform to imperfections in the surfaces at the ends of smart material device 190 thereby forming a tighter fit and extending the operational life of smart material device 190 by helping ensure that such surfaces are supported evenly despite small imperfections. As is shown in FIG. 1, an indentation 193 is formed in the illustrated embodiment of swage block 192 when swage block 192 is compressed and thereby lengthened, and thereby retaining smart material device 190 in compensator 180.

When smart material actuator 100 is fully assembled, substantially upon activation of smart material device 190, smart material device 190 urges first mounting surface 160 away from compensator 180. Outer plate inner resilient members 116, inner plate inner resilient members 146, outer plate outer resilient members 118, and inner plate outer resilient members 148 flex, thereby moving actuating arm 185. Due to the mechanical amplification inherent the structure of smart material actuator 100, actuating arm 185 moves across a distance greater than the expansion of smart material device 190.

Smart material device 190 may conveniently be a stack of piezoelectric, or other smart material, or may be a single piezoelectric crystal or layers of a single piezoelectric crystal. A feature of smart material device 190 is that it will change shape, and in particular will expand to increased length, upon application of a suitable electric potential. While the size and particular smart material used may vary according to application, smart material devices from manufacturers including NEC-Tokin (including without limitation part numbers AE0707D43H33, and AE0505D44), EPCOS (including without limitation part numbers LN04/8534, LN04/8671, LN04/8672) Ceramtec, and Kyocera are suitable for embodiments of actuator assemblies of the present invention.

First outer plate 112, second outer plate 132, inner plate 142, and second inner plate 162 may each be formed from a variety of materials including, without limitation stainless steel, steel, plastic, aluminum, ceramics or carbon fiber. By forming web assembly 110 from a series of plates joined together in this manner, web assembly 110 can be formed from thinner parts that are more inexpensive to manufacture, such as metal stamped from sheets. It is also possible to add or reduce the number of plates to create web assemblies of varying thicknesses and, therefore, different mechanical characteristics.

Figure 7:
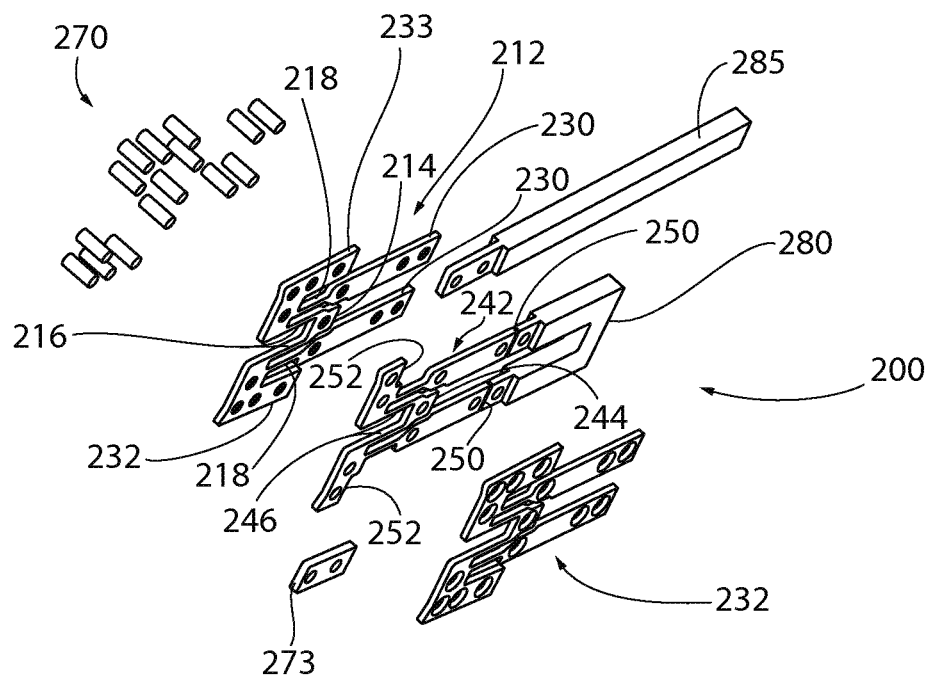
FIG. 7 is an exploded, perspective view of the web assembly, compensator, actuating arm and arm spacer of the embodiment illustrated in FIG. 6.

FIG. 7 illustrates an embodiment with three plates. As illustrated, first outer plate 212 and second outer plate 232 abut inner plate 242 when web assembly 210 is assembled and secured with connectors 270. Actuating arm 285, compensator 280, and arm spacer 273 are secured to web assembly 210 in the same manner, and with the same characteristics, as described above in connection with smart material actuator 100.

Figure 8:
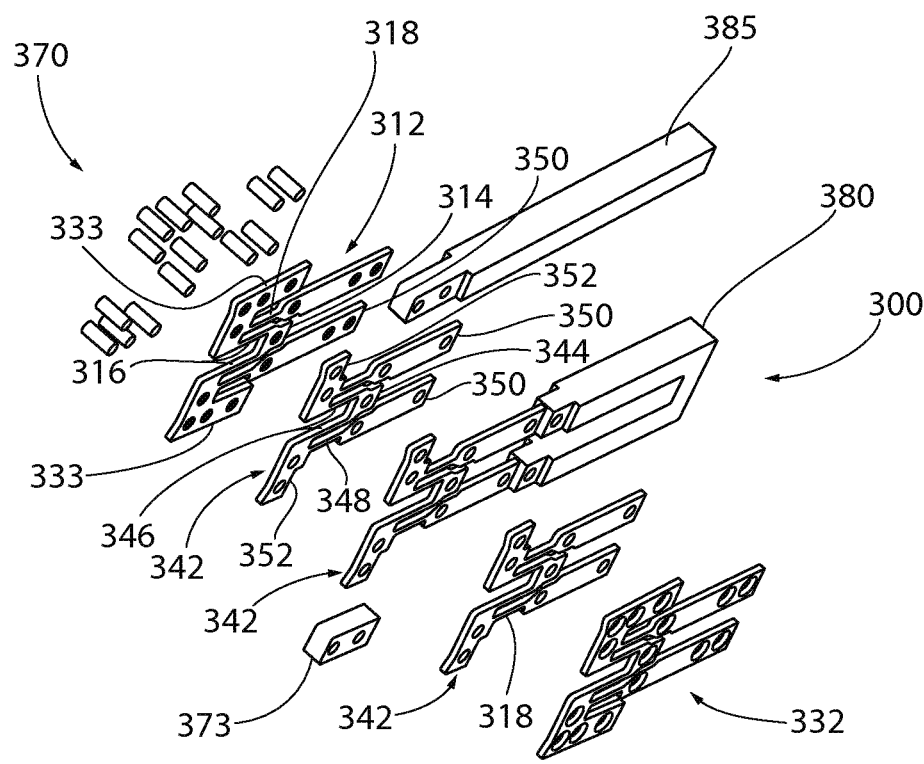
FIG. 8 is an exploded, perspective view of a web assembly, compensator, actuating arm spacer suitable for use in an actuator according to the present invention in which the web assembly comprises three inner plates.

Similarly, FIG. 8 illustrates an embodiment with five plates. As illustrated, three inner plates 342 are interposed between first outer plate 312 and second outer plate 332 and secured with connectors 370. Actuating arm 385, compensator 380 and arm spacer 373 are secured to web assembly 310 in the same manner, and with the same characteristics, as described above in connection with smart material actuator 100.

It can thus be seen that embodiments of smart material actuators 200 and 300 otherwise may be assembled and operated in substantially the same manner, and from substantially the same materials, as were described in connection with smart material actuator 100. It can also be seen how smart material actuators according to the present invention can be manufactured with no inner plates or a plurality of inner plates to form web assemblies of virtually any thickness. While embodiments of smart material actuators according to the present invention having web assembly thicknesses of 3 mm have been shown to be useful in a range of applications, many other sizes and configurations are possible for use in a wide variety of applications.

Figure 9:
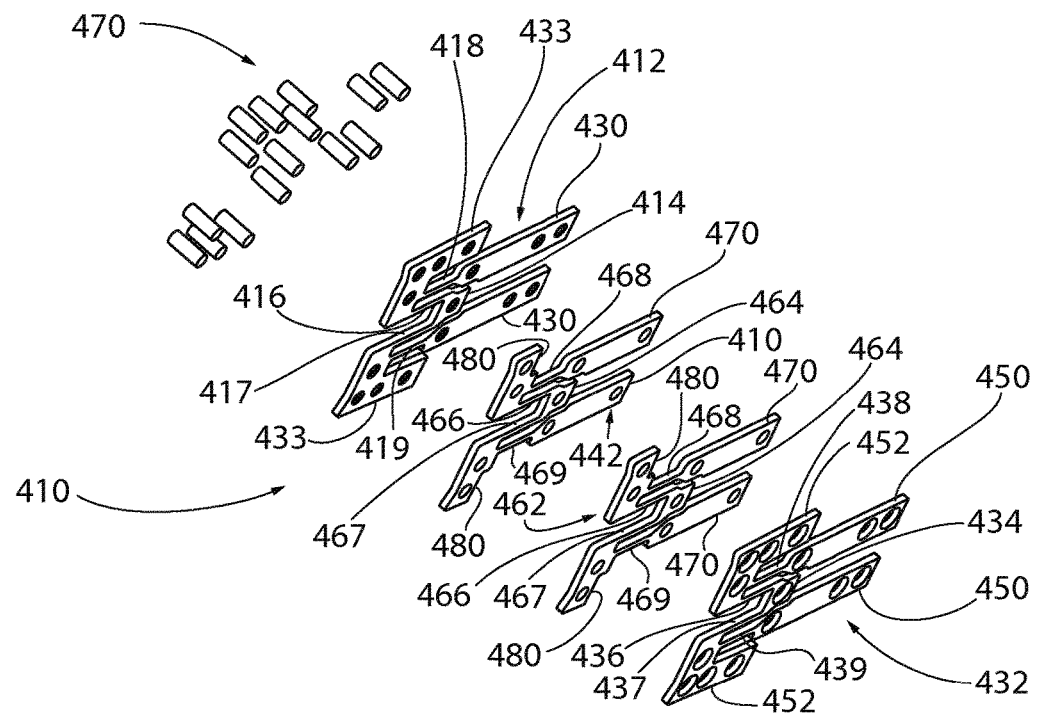
FIG. 9 is an exploded, perspective vie T of a web assembly according to the present invention.

The present invention further discloses web assemblies for use in a smart material actuator. Referring to FIG. 9, web assembly 410 comprises first outer plate 412 operably attached to a second outer plate 432. First outer plate 412 and said second outer plate 432 are substantially identical. Describing first outer plate 412, support surface 414 is operably connected to a first inner resilient member 416 and a second inner resilient member 417. First outer resilient member 418 is connected to first inner resilient member 412 and a second outer resilient member 419 is connected to second inner resilient member 417. First outer resilient member 418 and second outer resilient member 419 are each operably connected to a compensator attachment portion 430 adapted to attach to a compensator (not illustrated). First inner resilient member 416 and first outer resilient member 418 are operably connected to an actuating arm attachment portion 433 adapted to attach to an actuating (not illustrated). The result is a web assembly 410 that, when assembled with connectors 470, is structurally similar to web assemblies 110, 210, and 310 and wherein retaining compensator attachment portions 430 in a substantially fixed location, and urging support surfaces 414 away from compensator attachment portions 430 causes first inner resilient member 416 and first outer resilient member 418 to flex, thereby causing said actuating arm attachment potion 433 to move. Providing a web assembly ready for attachment of smart material devices, compensators, and actuating arms of different sizes allows for easy assembly of smart material actuators of varying sizes and characteristics.

Figure 10:
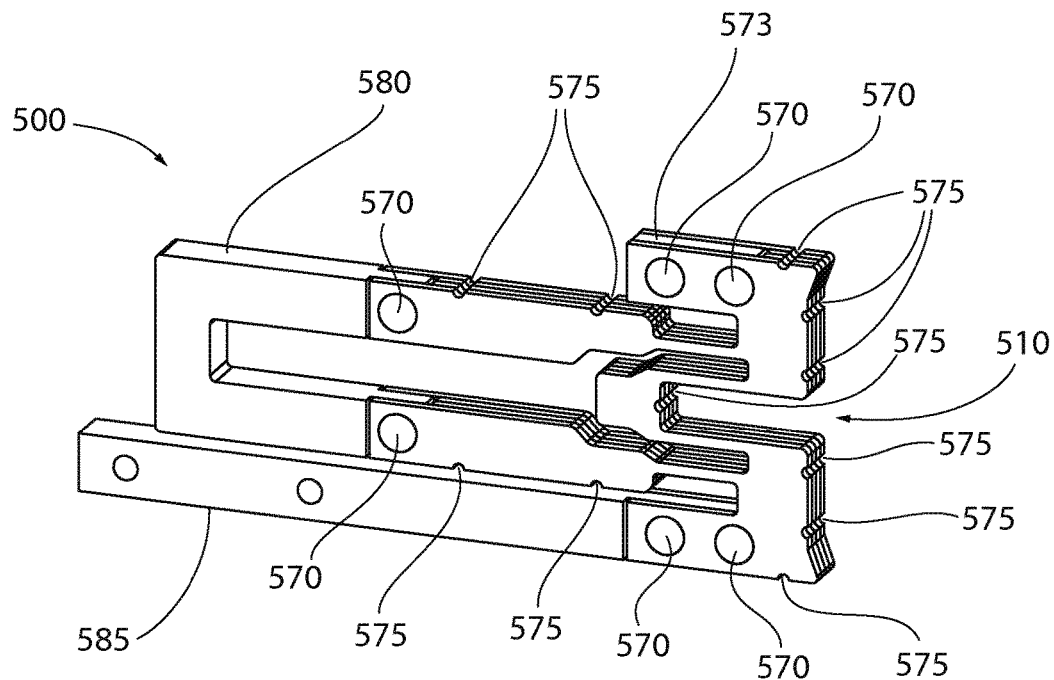
FIG. 10 is a perspective view of a preferred embodiment of the actuator assembly of the apparatus of the present invention prior to insertion of the smart material device in which the web assembly is adapted to be welded.

An alternative embodiment of a smart material actuator body 500 is shown in FIG. 10. As has been discussed, web assemblies of smart material actuators according to the present disclosure can be assembled by securing together a series of plates. In the embodiments described thus far, connectors 170, 270, 370, and 470 were illustrated and could be any mechanical connector adapted to secure the plates of web assemblies 110, 210, 310, and 410 respectively including, without limitation, rivets, pins, bolts, screws, bolts with sleeved receivers, and the like. In smart material actuator body 500, an alternate method of securing the plates of web assembly 510 together is shown. In such an embodiment, the plates of web assembly 510 could be welded together across all or substantial portions of their perimeters or at predefined locations. Divits 575 provide exemplary locations where the plates of web assembly 510 can be welded together. Once welded, connectors 570 can be used as illustrated to attach compensator 580, actuating arm 585, and arm spacer 573. For certain embodiments of web assemblies, welding may allow for a more efficient manufacturing process.

Figure 11:
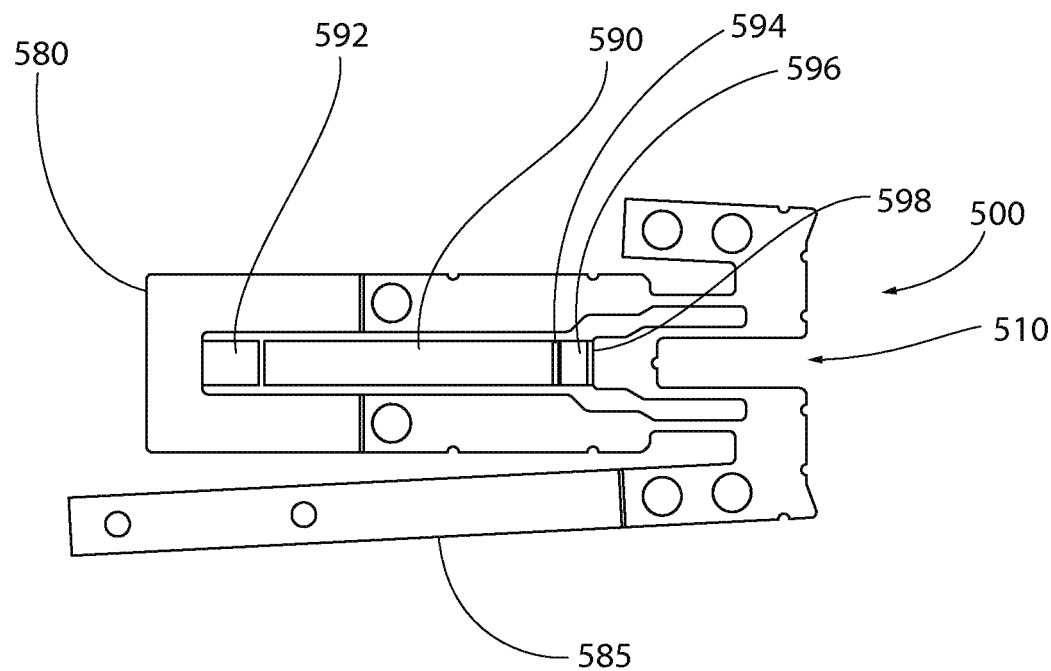
FIG. 11 is a side view of the embodiment illustrated in FIG. 10 in which the smart material device and related components have been positioned prior to final assembly.
Figure 12:
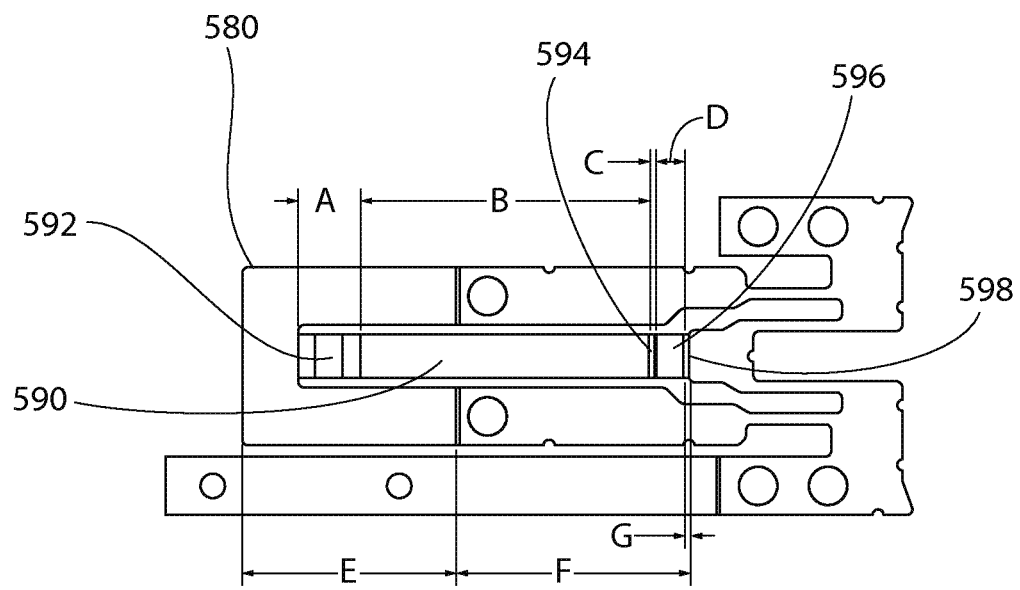
FIG. 12 is a side view of the embodiment illustrated in FIG. 11 after final assembly illustrating locations where measurements may be taken ire connection with calculating thermal stability.

As is illustrated in FIG. 11, once web assembly 510 is welded and compensator 580 and actuating arm 585 are secured, assembly can be completed by inserting swage block 592, smart material device 590, terminal 594, and spacers 596 and 598 in the space formed by compensator 580. Compressing swage block 592 then elongates swage block 592 and compresses smart material device 590 to both secure the assembly and provide desirable preload. As can be seen by comparing FIG. 11 and FIG. 12, prior to preloading smart material device 590, actuating arm 585 rests at an angle. After compression is applied, that angle changes leaving actuating arm 585 at the position chosen for the desired application.

Another advantage of the smart material actuator embodiments 100, 200, 300 and 500 is that they can be conveniently designed to provide thermal compensation. Different smart material actuators may be required to operate in environments having different temperature ranges. While a smart material actuator can be designed for narrower operating temperature range, it is often convenient to design it to operate across all or a substantial portion of the recommended operating temperature range of the smart material device used. In doing so, it can be desirable to choose and size materials with CTEs such that the net change in length of the actuator frame throughout the desired temperature range is approximately equal to the net change in length of the smart material device, swage block, terminal and spacers. It is notable that the CTE of a smart material device may vary according to the preload to which it is subject. Accordingly, preload should be taken into account when designing for thermal compensation, in addition to the CTE's of the materials selected for the other components.

Referring to FIG. 11 and using smart material actuator 500 as an example, thermal compensation is achieved where the sum of lengths E and F remain approximately equal to the sum of lengths A, B, C, D and G throughout the desired temperature range. At temperatures where that is not the operating characteristics of smart material actuator 500 can change at certain temperatures, including the pre-activation and post-activation angle of actuating arm 585 with respect to smart material device 590.

While different materials may be used to achieve the desired thermal compensation, it has been found that use of Invar for compensator 580, 301/17-4 for the plates making up web assembly 510, aluminum for swage block 592, brass for terminal 594, ceramic for stack spacer 596 and aluminum for second stack spacer 598 can yield a smart material actuator 500 that remains thermally balanced across a temperature range in line with the recommended operating temperatures of commonly available smart material devices. The precise thicknesses and sizes of the components will vary based on the overall size of the actuator and the operating characteristics required for the application. The relative dimensions shown in FIGS. 10-12 have been found to be suitable to create a smart material actuator that is thermally balanced for typical applications when compensator 580 is formed of invar, web assembly 510 is formed of stainless steel, swage block 592 is formed of aluminum, insulating spacer 596 is formed of ceramic, and the thickness of web assembly 510 is approximately three millimeters.

Figure 13:
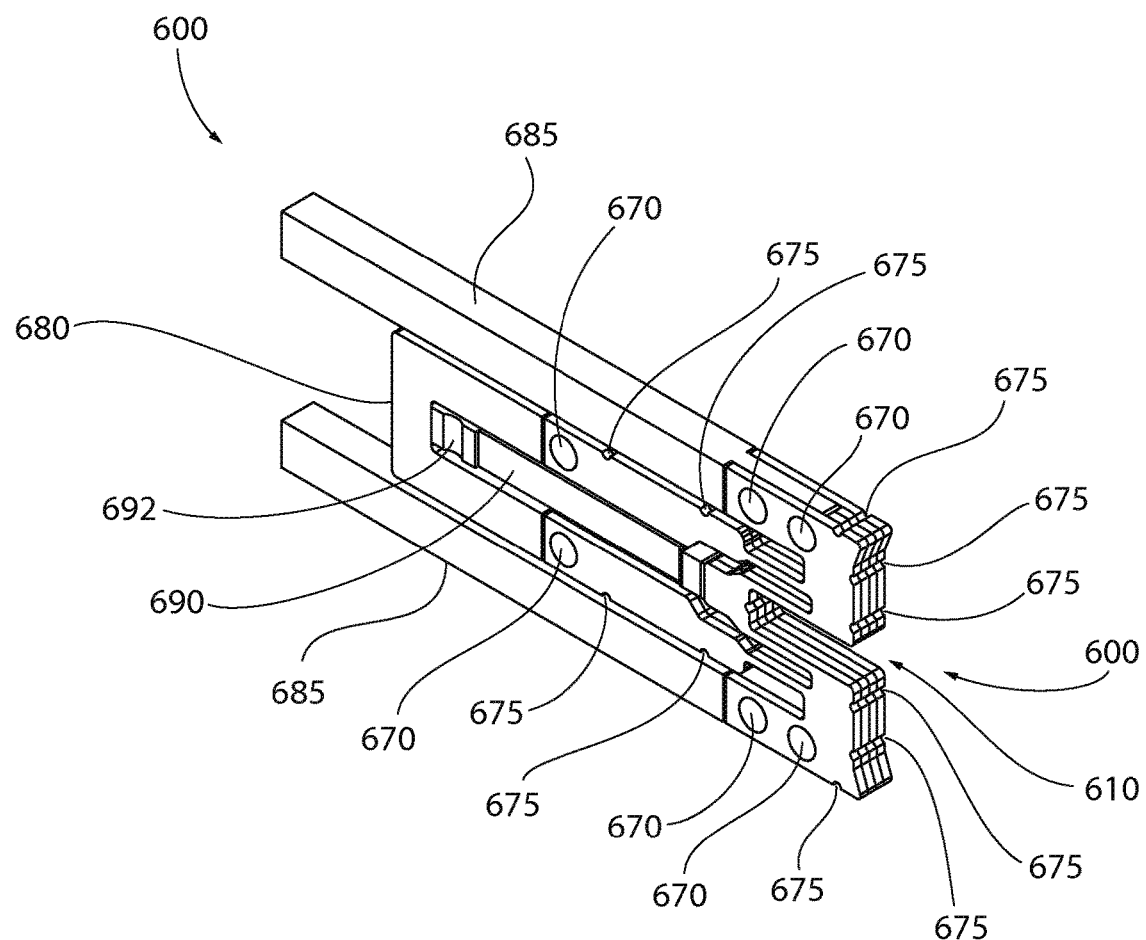
FIG. 13 is a perspective view of a preferred embodiment of an actuator assembly according to the present invention having two actuating arms.

As has been noted above, embodiments of smart material actuators having one or two actuating arms may be created according to the teachings herein. Referring to FIG. 13, and embodiment of a smart material actuator 600 having two actuating arms 685 is shown. As with the previously discussed embodiments, web assembly 610 is welded at divet points 675 and attached to compensator 680 and actuating arms 685 with connectors 670. The result is a smart material actuator that, when smart material device 690 is activated, moves the outer ends of actuating arms 685 toward one another. This configuration is particularly desirable where a second stage (not illustrated) is attached to the outer ends of actuating arms 685 to create a linear motion as is described in the incorporated references and, in particular, FIG. 2 of U.S. Publication No. 2013-0234561.

As is demonstrated by the incorporated references, and in particular U.S. Publication No. 2012-0001518, having actuating arms that operate at different angles or actuating arias that extend in the opposite direction can be desirable for certain applications. As also demonstrated by the incorporated references and in particular U.S. Publication Nos. 2012-0001518 and 2011-0309721, smart actuators of a variety of sizes can also be desirable for certain applications. It will be apparent to those of ordinary skill in the art that web assemblies utilizing plates as described herein can be used to create smart material actuators with a wide variety of arm lengths and in a wide variety of sizes, including by using web assemblies utilizing plates to form web assemblies having similar configurations and dimensions as those shown in the incorporated references.

Finally, it will be understood that in light of this disclosure and the incorporated references, and in particular U.S. Publication Nos. 2012-0001518, 2011-0309721 and 201-0038245 that smart material actuators such as those described herein can also be used as energy capture devices or sensors.

Other variations and embodiments of the present invention will be apparent to those of ordinary skill in the art in light of this specification, all of which are within the scope of the present invention as claimed. Nothing in the foregoing description is intended to imply that the present invention is limited to the preferred embodiments described herein.

We claim:

1. A smart material actuator comprising a web assembly, a compensator, an actuating arm and a smart material device;
    said web assembly comprising a first outer plate, a second outer plate, and at least one inner plate interposed between said first outer plate and said second outer plate;
    said first outer plate and said second outer plate comprising an outer plate support surface connected to two outer plate inner resilient members, two outer plate outer resilient members operably connected to a compensator attachment portion; and an actuating arm attachment portion;

each said inner plate comprising an inner plate support surface connected to two inner plate inner resilient members, and two inner plate outer resilient members connected to a compensator support portion, and an actuating arm support portion;

said compensator being adapted to attach to said compensator attachment portions and supported by said compensator support portions;

said actuating arm being adapted to attach to said actuating arm attachment portions and be supported by said actuating arm support portions;

said smart material device being situated between a first mounting surface and said compensator, retained by a swage block;

said first mounting surface comprising said first outer plate support surface, second outer plate support surface, and said inner plate support surface;

said first outer plate, said second outer plate, and said at least one inner plate being operably attached together;

wherein upon activation of said smart material device, said smart material device urges said first mounting surface away from said compensator and said outer plate inner resilient members, inner plate inner resilient members, outer plate outer resilient members, and inner plate outer resilient members flex, thereby moving said actuating arm attachment and said actuating arm.

2. The smart material actuator of claim 1 comprising only one of said inner plates.

3. The smart material actuator of claim 1 comprising a plurality of said inner plates.

4. The smart material actuator of claim 1 wherein said first outer plate, said second outer plate and said at least one inner plate are operably attached with a plurality of connectors.

5. The smart material actuator of claim 4 wherein said connectors are rivets.

6. The smart material actuator of claim 4 wherein said connectors comprise bolts.

7. The smart material actuator of claim 1 wherein said first outer plate, said second outer plate and said at least one inner plate are welded together.

8. The smart material actuator of claim 1 wherein said actuating arm is operably attached to said actuating arm attachment portions with at least one connector.

9. The smart material actuator of claim 8 wherein said at least one connector is a rivet.

10. The smart material actuator of claim 8 wherein said at least one connector comprises a bolt.

11. The smart material actuator of claim 1 wherein said actuating arm is welded to said actuating arm attachment portions.

12. The smart material actuator of claim 1 wherein said swage block is aluminum.

13. The smart material actuator of claim 1 further comprising a terminal in electrical connection with said smart material device and an insulator electrically interposed between said terminal and said support surface.

14. The smart material actuator of claim 1 further comprising a second actuating arm wherein said first outer plate and said second outer plate further comprise a second actuating arm attachment portion and said second actuating arm is operably attached to said second actuating arm attachment portion.

15. The smart material actuator of claim 1 wherein said first outer plate and said second outer plate are formed of material having a coefficient of thermal expansion that differs from the coefficient of thermal expansion of stainless steel by no more than ten percent, said compensator is formed of a material having a coefficient of thermal expansion that differs from the coefficient of thermal expansion of invar by no more than ten percent, and said swage block is formed of a material having a coefficient of thermal expansion that differs from the coefficient of thermal expansion of aluminum by no more than ten percent.

16. The smart material actuator or claim 1 wherein said first outer plate and said second outer plate are formed of stainless steel, said compensator is formed of invar, and said swage block is formed of aluminum.

17. A web assembly for use in a smart material actuator comprising a first outer plate operably attached to a second outer plate;

said first outer plate and said second outer plate each comprising a support surface operably connected to a first inner resilient member and a second inner resilient member;

said first outer plate and said second outer plate each further comprising a first outer resilient member connected to said first inner resilient member and a second outer resilient member connected to said second inner resilient member;

said first outer resilient member and said second outer resilient member each being operably connected to a compensator attachment portion adapted to attach to a compensator; and said first inner resilient member and said first outer resilient member being operably connected to an actuating arm attachment portion adapted to attach to an actuating arm;

wherein retaining said compensator attachment portions in a substantially fixed location, and urging said support surfaces away from said compensator attachment portions causes said first inner resilient member and said first outer resilient member to flex, thereby causing said actuating arm attachment potions to move.

18. The web assembly of claim 17 further comprising at an inner plate interposed between said first outer plate and said second outer plate, said inner plate comprising an inner plate support surface operably connected to a first inner plate inner resilient member and a second inner plate inner resilient member;

said inner plate further comprising a first inner plate outer resilient member connected to said first inner plate inner resilient member and a second inner plate outer resilient member connected to said second inner plate inner resilient member;

said first inner plate outer resilient member and said second inner plate outer resilient member each being operably connected to a compensator support portion adapted to support a compensator; and said first inner plate inner resilient member and said first inner plate outer resilient member being operably connected to an actuating arm support portion adapted to support an actuating arm.

19. A method of assembling a smart material actuator comprising a web assembly, a compensator, an actuating arm, a swage block, and a smart material device, said web assembly comprising a support surface connected to at least one inner resilient members and at least one outer resilient member connected to a compensator and an actuating arm;

said method comprising the steps of positioning said smart material device and said swage block within said compensator; and elongating said swage block to compress said smart material device against said support surface.

* * * * *